US006377103B1

United States Patent
Mooney et al.

(10) Patent No.: US 6,377,103 B1
(45) Date of Patent: Apr. 23, 2002

(54) SYMMETRIC, VOLTAGE-CONTROLLED CMOS DELAY CELL WITH CLOSED-LOOP REPLICA BIAS

(75) Inventors: Stephen R. Mooney; Matthew B. Haycock, both of Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/605,459

(22) Filed: Jun. 28, 2000

(51) Int. Cl.[7] .............................................. H03H 11/26
(52) U.S. Cl. ....................... 327/277; 327/276; 327/281
(58) Field of Search ................................ 327/261, 277, 327/284, 270, 272, 276, 281

(56) References Cited

U.S. PATENT DOCUMENTS

| 5,128,962 A | 7/1992 | Kerslake et al. ................ 345/7 |
| 5,164,960 A | 11/1992 | Winen et al. .................. 375/10 |
| 5,479,652 A | 12/1995 | Dreyer et al. .......... 395/183.06 |
| 5,541,535 A | 7/1996 | Cao et al. ....................... 326/83 |
| 5,568,064 A | 10/1996 | Beers et al. .................... 326/31 |
| 5,604,450 A | 2/1997 | Borkar et al. .................. 326/82 |
| 5,641,931 A | 6/1997 | Ogai et al. ..................... 84/661 |
| 5,666,302 A | 9/1997 | Tanaka et al. ................ 364/825 |
| 5,905,391 A | 5/1999 | Mooney ....................... 327/161 |
| 6,040,714 A | 3/2000 | Klein .......................... 326/86 |
| 6,073,151 A | 6/2000 | Baker et al. ................. 708/290 |
| 6,150,862 A | * 11/2000 | Vikinski ....................... 327/281 |
| 6,239,642 B1 | * 5/2001 | Kim et al. ................... 327/277 |

FOREIGN PATENT DOCUMENTS

JP 405129908 * 5/1993 ................. 327/277

OTHER PUBLICATIONS

Haycock, M., et al., "A 2.5Gb/s Bidirectional Signaling Technology", *Hot Interconnects Symposium V*, pp. 1–8, (Aug. 1997).

* cited by examiner

*Primary Examiner*—Dinh T. Le
(74) *Attorney, Agent, or Firm*—Schwegman, Lundberg, Woessner & Kluth, P.A.

(57) ABSTRACT

A voltage-controlled CMOS delay cell includes a pair of inverters and a pair of load cells. The load cells are controllable by independent N and P bias control voltages to vary the delay of the delay cell. Symmetric P and N load capacitors in the delay cells, together with the N and P bias control voltages, provide effective rejection of noise on the power supply rails and enable the delay cell to generate symmetric low-going and high-going delays. The P bias control voltage is generated from the N bias control voltage by a closed-loop voltage control circuit. Also described are a voltage-controlled load cell, an integrated circuit, an electronic system, and a data processing system that incorporate one or more of the symmetric CMOS voltage-controlled delay cells.

24 Claims, 4 Drawing Sheets

SYMMETRIC, VOLTAGE-CONTROLLED CMOS DELAY CELL WITH CLOSED-LOOP REPLICA BIAS

RELATED INVENTIONS

The present invention is related to the following inventions which are assigned to the same assignee as the present invention:

(1) Ser. No. 09/470,091, filed Dec. 21, 1999, entitled "Method and Apparatus to Structurally Detect Random Defects That Impact AC I/O Timings in an Input/Output Buffer";

(2) Ser. No. 09/474,874, filed Dec. 29, 1999, entitled "Method and Apparatus for Conducting Input/Output Loop Back Tests Using a Local Pattern Generator and Delay Elements"; and (3) Ser. No. 09/605,624, filed Jun. 28, 2001, entitled "Digital Variable-Delay Circuit Having Voltage-Mixing Interpolator and Methods of Testing Input/Output Buffers Using Same".

TECHNICAL FIELD OF THE INVENTION

The present invention relates generally to integrated circuits. More particularly, the present invention relates to a delay circuit that provides symmetric delay.

BACKGROUND OF THE INVENTION

Integrated circuits (ICs) typically contain one or more functional logic blocks (FLB), such as a microprocessor, microcontroller, graphics processor, bus interface circuit, input/output (I/O) circuit, memory circuit, and the like. IC's are typically assembled into packages that are physically and electrically coupled to a substrate such as a printed circuit board (PCB) or a ceramic substrate to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the testing of ICs, where each new generation of IC's must provide increased performance while generally being smaller or more compact in size. IC's must generally be tested before they are incorporated into an electronic assembly in order to verify that each component of each FLB on the IC functions properly and to verify that the input/output (I/O) circuits of each IC operate correctly within specified timing parameters or timing margins.

In testing IC's, it is known to employ I/O loopback or switching state (AC) testing, as for example disclosed in Related Inventions Nos. 1 and 2 above. In I/O loopback testing, data is generated by a FLB within the IC and output through the driver or output component of each I/O circuit. Subsequently, the data is received through the receiver or input component of each I/O circuit and conveyed to the FLB to verify that the correct data has been received. In this manner, the IC can verify that the input and output components of each I/O buffer are correctly operating.

It is known to use source synchronous data transfer on busses interconnecting FLB's within a single IC or within an electronic assembly comprising one or more IC's. In a source synchronous interface, a receiving I/O buffer captures data based upon a strobe clock that is provided by another FLB or IC device driving the data.

The use of digital delay circuits on IC's to assist in centering a strobe signal with respect to a data cell is known in the art, such as for example the delay locked loop disclosed in U.S. Pat. No. 5,905,391 assigned to the assignee of the present invention.

In order to capture source synchronous data within an FLB, and in order to test whether source synchronous interfaces are operating properly, it is desirable to be able to vary the delay of a digital delay circuit in order to shift a strobe signal with respect to a data bit cell time.

Further, in order to reduce pattern dependent jitter in circuitry that is used to capture source synchronous data within an FLB, it is desirable that all nodes of the circuitry have a bandwidth higher than the data frequency. However, capacitor nodes in delay cells often have low bandwidth at low bias levels.

In addition, many electronic applications require a delay circuit to provide a symmetric output, wherein the delay in generating a low/high transitioning delay signal, as measured from a time point of reference, is the same as the delay in generating a high/low transitioning delay signal.

For the reasons stated above, and for other reasons stated below which will become apparent to those skilled in the art upon reading and understanding the present specification, there is a significant need in the art for a delay circuit in which the amount of signal delay can be easily controlled, that can operate at high data or clock speeds, and that can provide a symmetric output.

In addition, there is a significant need in the art for a delay circuit that can support reliable source synchronous signaling and the testing of source synchronous signaling circuitry.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides a voltage-controlled CMOS delay cell that includes a pair of inverters and a pair of load cells. The load cells are controllable by independent N and P bias voltages to vary the delay of the delay cell. Symmetric P and N load capacitors in the delay cells, together with the N and P bias control voltages, effectively reject noise on the power supply rails and also enable the delay cell to generate symmetric low-going and high-going delays. The P bias voltage is replicated from an N bias control voltage by a closed-loop voltage control circuit. Also described are an electronic system and a data processing system that incorporate one or more of the symmetric CMOS voltage-controlled delay cells.

Figure 1:
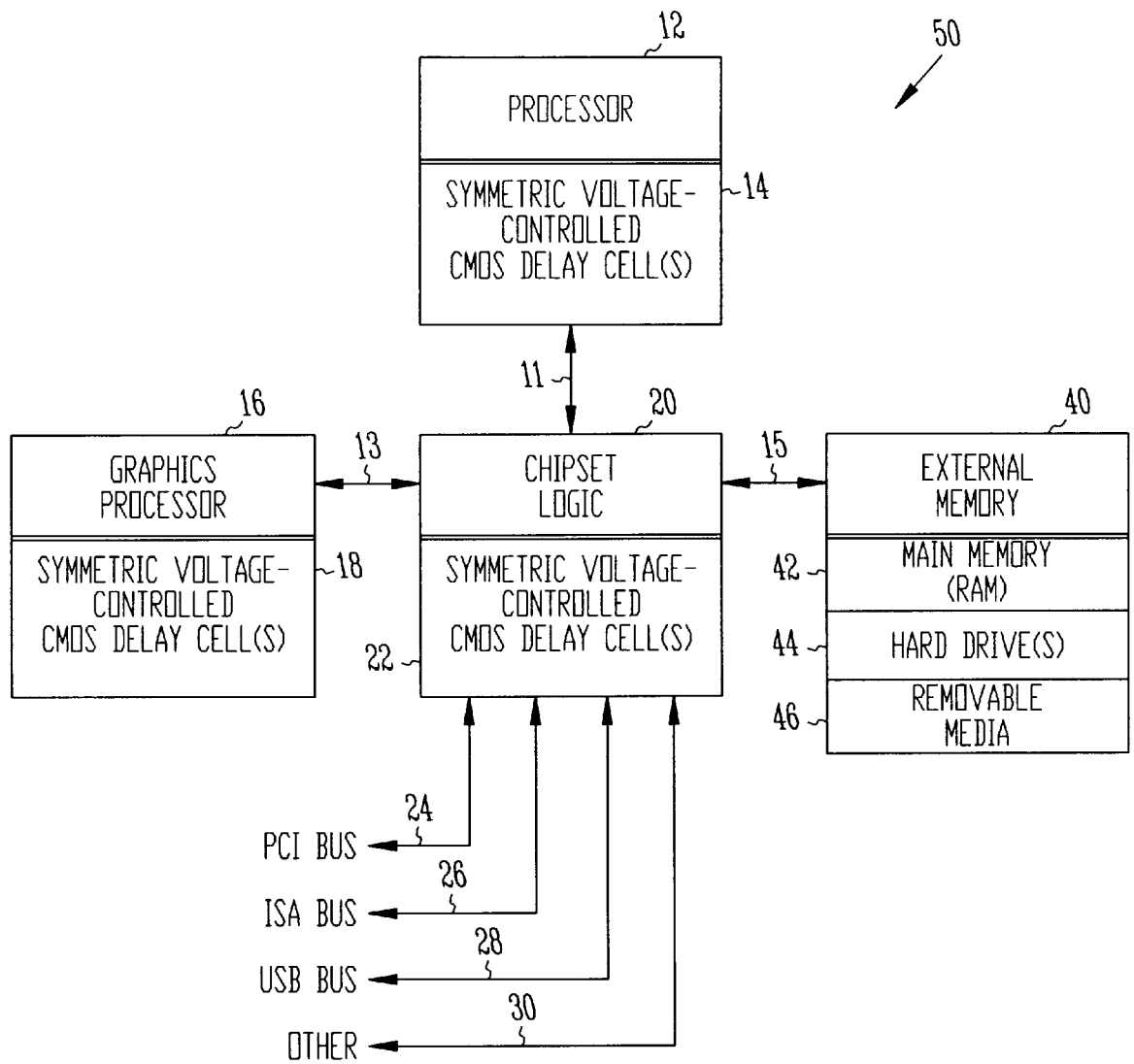
FIG. 1 illustrates a block diagram of an electronic system incorporating at least one symmetric voltage-controlled CMOS delay cell, in accordance with one embodiment of the invention.

FIG. 1 illustrates a block diagram of an electronic system 50 incorporating at least one symmetric voltage-controlled CMOS delay cell, in accordance with one embodiment of the invention. In the example shown, electronic system 50 is a data processing system that comprises a plurality of components, including processor 12, a graphics processor 16, chipset logic 20, and external memory 40. These components are coupled to one or more busses 11, 13, and 15. Other components (not illustrated) can be included in the data processing system, such as a keyboard, cursor control, display monitor, modem, printer, scanner, speaker, game controller, sensor, actuator, and so forth.

As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Chipset logic 20 can be any one or more supporting circuits that couple processor 12 to external devices. For example, chipset logic 20 can include input/output (I/O) circuits, bus circuits, debug circuits, node control circuits, port switching circuits, memory controller circuits, and so forth.

In one embodiment, chipset logic 20 provides interfaces to various internal and external busses, such as a PCI bus 24, an ISA bus 26, and a USB bus 28. Chipset logic 20 can also provide an interface to any other desired bus, functional logic block (FLB), IC, or external device such as external memory 40, a network circuit, or the like via I/O line 30. It will be understood that external memory 40 could also be coupled to chipset logic 20 via one of bus I/O lines 24, 26, or 28.

External memory 40 can include main memory 42 in the form of random access memory (RAM), one or more hard drives(s) 44, and removable media 46 such as diskettes, compact disks (CD's), digital video disks (DVD's), and the like.

Processor 12, graphics processor 16, chipset logic 20, and RAM 42 can all be implemented on ICs. In the example shown in FIG. 1, chipset logic 20 comprises at least one IC that includes, in addition to other circuits, at least one symmetric voltage-controlled CMOS delay cell 22, in accordance with the present invention, as will be explained in further detail below. Chipset logic 20 can comprise a plurality of IC's in other embodiments, and normally each IC of the chipset logic 20 will include at least one symmetric voltage-controlled CMOS delay cell of the type described herein.

Processor 12 is an integrated circuit comprising, in addition to other circuits, at least one symmetric voltage-controlled CMOS delay cell 14, in accordance with the present invention. Likewise, graphics processor 16 is an integrated circuit comprising, in addition to other circuits, at least one symmetric voltage-controlled CMOS delay cell 16, in accordance with the present invention. Other integrated circuits in the electronic system 50 can optionally comprise at least one symmetric voltage-controlled CMOS delay cell, if it is desired to achieve the advantages provided by the present invention. The ICs in electronic system 50 will normally contain many logic circuits, each of which may comprise symmetric voltage-controlled CMOS delay cells as disclosed herein.

The present invention, however, is not to be construed as limited to any particular architecture or combination of functional elements or ICs. Its use is extremely flexible, being readily adaptable to any electronic system 50 in which its advantages are desired to be achieved. Electronic system 50 is merely one example of an electronic system in which the present invention can be used. Other types of electronic systems with which the present invention can be used include communications equipment, such as Internet computers, cellular telephones, pagers, and two-way radios; entertainment systems; process control systems; aerospace equipment; automotive equipment; and similar electronic systems.

Each of the major elements depicted in the electronic system 50 of FIG. 1 can comprise one or more functional logic blocks (FLB's). The symmetric voltage-controlled CMOS delay cell of the present invention is typically used on FLB's that contain I/O buffer circuits that communicate with other off-chip FLB's, but its use is not limited to such FLB's, and it can be used to communicate with on-chip FLB's, for example. More broadly, the present invention can be used in any electronic circuit or electronic system requiring a controllable delay circuit that can provide an accurate, adjustable signal delay. For example, the delay cell of the present invention can be used to control the slew rate of a line driver. As another example, it can be used to control a clock signal.

Figure 2:
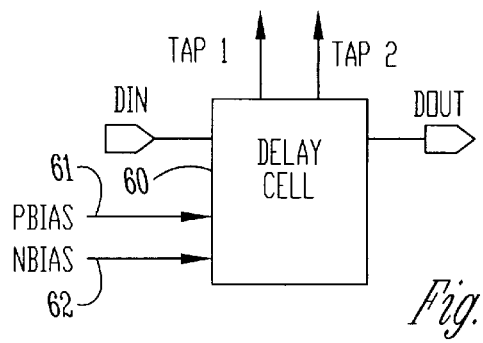
FIG. 2 illustrates a symbolic block diagram of a symmetric voltage-controlled CMOS delay cell, in accordance with one embodiment of the invention.

FIG. 2 illustrates a symbolic block diagram of a symmetric voltage-controlled CMOS delay cell 60, in accordance with one embodiment of the invention. Delay cell 60 has a signal input node DIN and produces a delayed signal at output node DOUT that is symmetrical in its low-to-high and high-to-low propagation delay characteristics or attributes, as will be seen below regarding FIG. 6.

The amount of signal delay provided by delay cell 60 is controlled by independent P and N bias signals applied via lines 61 and 62, respectively. The independent P and N bias signals, in conjunction with internal circuitry of delay cell 60 to be described in greater detail below, improve the jitter characteristics of the delay cell 60 over a relatively wide delay range. In addition, they also enable the delay cell 60 to generate a delay signal whose propagation delay characteristics are symmetrical, as mentioned earlier.

Delay cell 60 also generates Tap 1 and Tap 2 outputs. One or both of these delay taps can be utilized, for example, when delay cell 60 forms part of a functional logic block such as a delay locked loop (DLL). Related Invention (3), for example, discloses the use of delay cells which can preferably be of the type described in the present invention, and each of which provides an output tap to selection logic such as a multiplexer. The output tap can be either Tap 1 or Tap 2 from each of a plurality of delay cells like delay cell 60 in FIG. 2. Output Taps 1 and 2 can be used for many other purposes within electronic circuits in addition to the above example.

Figure 3:
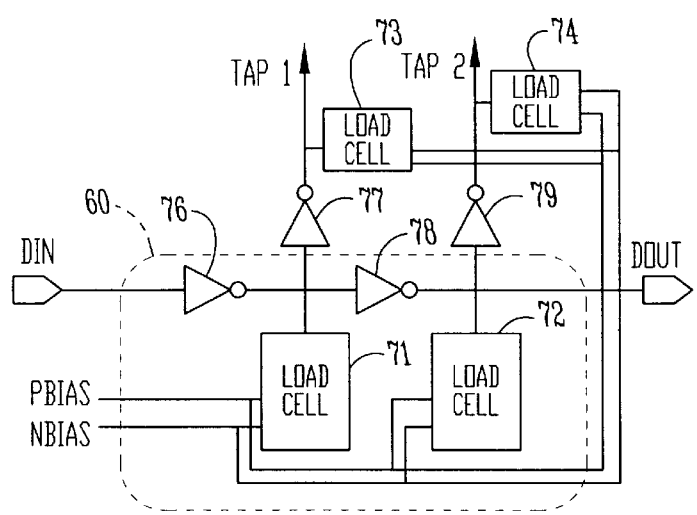
FIG. 3 illustrates a more detailed block diagram of a symmetric voltage-controlled CMOS delay cell, in accordance with one embodiment of the invention.

FIG. 3 illustrates a more detailed block diagram of a symmetric voltage-controlled CMOS delay cell 60, in accordance with one embodiment of the invention. Delay cell 60 includes a delay line, which in one embodiment comprises a pair of inverters 76 and 78 coupled in series between the signal input DIN and the delayed signal output DOUT. The output of each inverter 76 and 78 also drives a respective load cell 71 and 72. Each load cell 71 and 72 is supplied by independent PBIAS and NBIAS signals.

If optional Tap 1 and Tap 2 are desired, an additional pair of inverters 77 and 79 are provided, with their inputs coupled to the outputs of inverters 76 and 78, respectively, and their outputs coupled to respective load cells 73 and 74. Like load cells 71 and 72, load cells 73 and 74 are supplied by independent PBIAS and NBIAS signals.

The NBIAS signal is an analog control signal that is applied to the delay cell 60 for the purpose of varying the amount of delay it provides. The NBIAS signal can be generated, for example, by a phase detector of a digital delay line. The PBIAS signal is generated from the NBIAS signal, using a voltage control circuit, one embodiment of which is illustrated in and described regarding FIG. 5 below.

Figure 4:
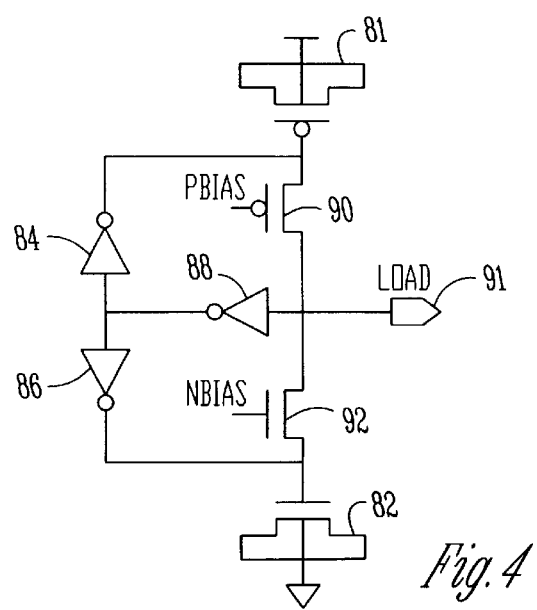
FIG. 4 illustrates a circuit diagram of a load cell of a symmetric voltage-controlled CMOS delay cell, in accordance with one embodiment of the invention.

FIG. 4 illustrates a circuit diagram of a load cell of a symmetric voltage-controlled CMOS delay cell, in accordance with one embodiment of the invention. Any of the load cells 71–74 shown in FIG. 3, for example, can be implemented with the circuit shown in FIG. 4.

The load cell comprises a P-type transistor 90, whose source is coupled to the drain of an NMOS transistor 92 and to a LOAD node or terminal 91. The gate of PMOS transistor 90 is coupled to PBIAS, and the gate of NMOS transistor 92 is coupled to NBIAS.

The drain of PMOS transistor 90 is coupled to the gate of a source-drain connected PMOS capacitor 81. The source-drain node of PMOS capacitor 81 is coupled to a power supply potential such as Vcc.

The source of NMOS transistor 92 is coupled to the gate of a source-drain connected NMOS capacitor 82. The source-drain node of NMOS capacitor 82 is coupled to a power supply potential such as Vss.

The combination of PMOS capacitor 81 and PMOS transistor 90 form an resistive-capacitive (R-C) element or circuit, as does the combination of NMOS capacitor 82 and NMOS transistor 92. Each of these R-C elements has a delay characteristic that is controllable by the PBIAS or NBIAS control voltage, respectively. For example, as NBIAS is increased, NMOS transistor 92 will become less resistive, and the capacitance of NMOS capacitor 82 will increase, so the delay will be longer because it will take longer to charge up the load cell.

The symmetric load capacitors 81 and 82 between the LOAD node and the Vcc and Vss supply voltages, respectively, together with the PBIAS and NBIAS control signals, provide effective rejection of noise on the power supply rails, because both the delay buffer (comprising inverters 76 and 78) and their controllable load cells 71 and 72, respectively, will vary in proportion to noise on the supply rails.

In order to use delay cell 60 (FIGS. 2 and 3) for the delay of data in slew rate control applications, or for the delay of clock signals, all nodes should have a bandwidth higher than the data or clock frequency; otherwise, pattern dependent jitter can result.

Because the capacitor nodes, such as the PMOS capacitor 81 and the NMOS capacitor 82, in the load cell can have low bandwidth at low bias levels, voltage level restoring circuitry can be provided, which in one embodiment takes the form of a trio of voltage level restoring inverters 84, 86, and 88. The input of inverter 88 is coupled to the LOAD node, and its output is coupled to the inputs of inverters 84 and 86. The output of inverter 84 is coupled to the source-drain node of PMOS capacitor 81, and the output of inverter 86 is coupled to the source-drain node of NMOS capacitor 82.

Voltage level restoring inverters 84, 86, and 88 restore the voltage level on the gates of the PMOS capacitor 81 and the NMOS capacitor 82 during every periodic clock cycle to ensure that the capacitive charge is discharged during every cycle. This helps to reduce variations in the delay characteristics of the delay cell.

Figure 5:
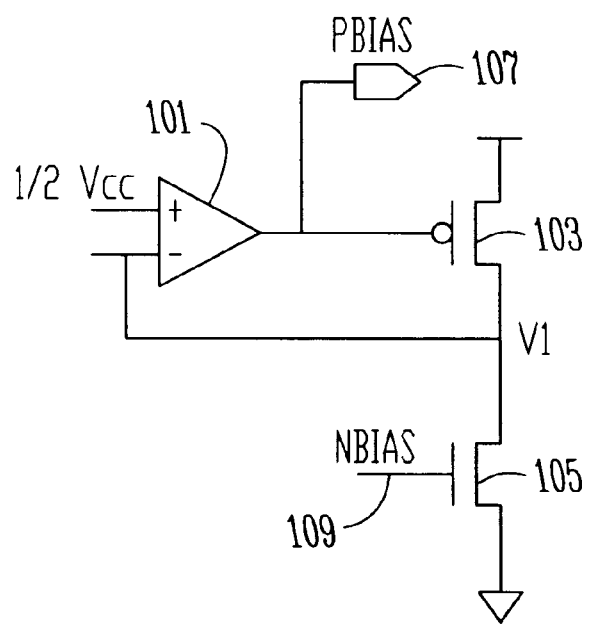
FIG. 5 illustrates a circuit diagram of a voltage control circuit of a symmetric voltage-controlled CMOS delay cell, in accordance with one embodiment of the invention.

FIG. 5 illustrates a circuit diagram of a voltage control circuit of a symmetric voltage-controlled CMOS delay cell, in accordance with one embodiment of the invention. The voltage control circuit comprises a CMOS pair of transistors 103 and 105. PMOS transistor 103 has its drain coupled to a power supply voltage such as Vcc and its source coupled to the drain of NMOS transistor 105, whose source is coupled to a power supply voltage such as Vss.

The gate of NMOS transistor 105 is coupled to the NBIAS control signal, which is an analog control signal that is applied to the delay cell 60 (FIGS. 2–3) for the purpose of varying the amount of delay it provides. The NBIAS signal can be generated, for example, by a phase detector.

The gate of PMOS transistor 103 is coupled to the output of a unity gain differential amplifier 101 and to a PBIAS output node 107. The "+" input of differential amplifier 101 is coupled to a reference potential of ½ Vcc, and the "−" input of differential amplifier 101 is coupled to a V1 node intermediate the source of PMOS transistor 103 and the drain of NMOS transistor 105. Differential amplifier 101 sets the PBIAS signal so that the intermediate node V1 is at ½ Vcc. This sets the drain saturation current of the PMOS and NMOS transistors 103 and 105, respectively, to be approximately equal.

The NBIAS and PBIAS control voltages are coupled to mirror elements in the load cells. The PMOS and NMOS transistors 103 and 105, respectively, in the voltage control circuit mirror the characteristics of the PMOS and NMOS pass transistors 90 and 92, respectively, in the load cell (FIG. 4). The load cell transistors 90 and 92 then have equal drive, and they generate symmetric low/high and high/low propagation delays in the delay cell 60 (FIGS. 2–3).

Figure 6:
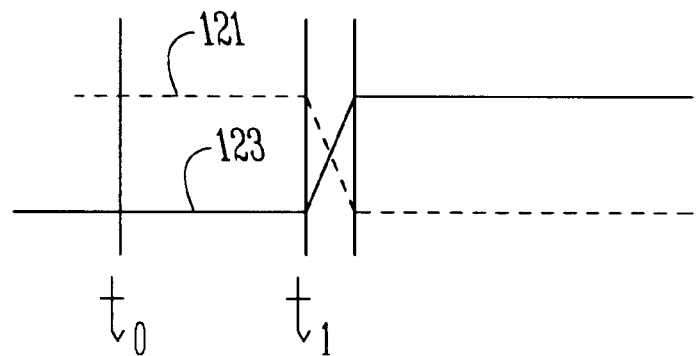
FIG. 6 illustrates a timing diagram, depicting symmetric delays generated by a symmetric voltage-controlled CMOS delay cell, in accordance with one embodiment of the invention.

FIG. 6 illustrates a timing diagram, depicting symmetric delays generated by a symmetric voltage-controlled CMOS delay cell, in accordance with one embodiment of the invention. Relative to time reference $t_0$ when hypothetical signals 121 and 123 enter the delay cell, signal 121 that is transitioning high/low does so at the same time $t_1$ as signal 123 that is transitioning low/high. The fact that either signal, once it encounters the delay cell, transitions at the same time duration $t_1$ from $t_0$, is referred to as "symmetric delay".

Figure 7:
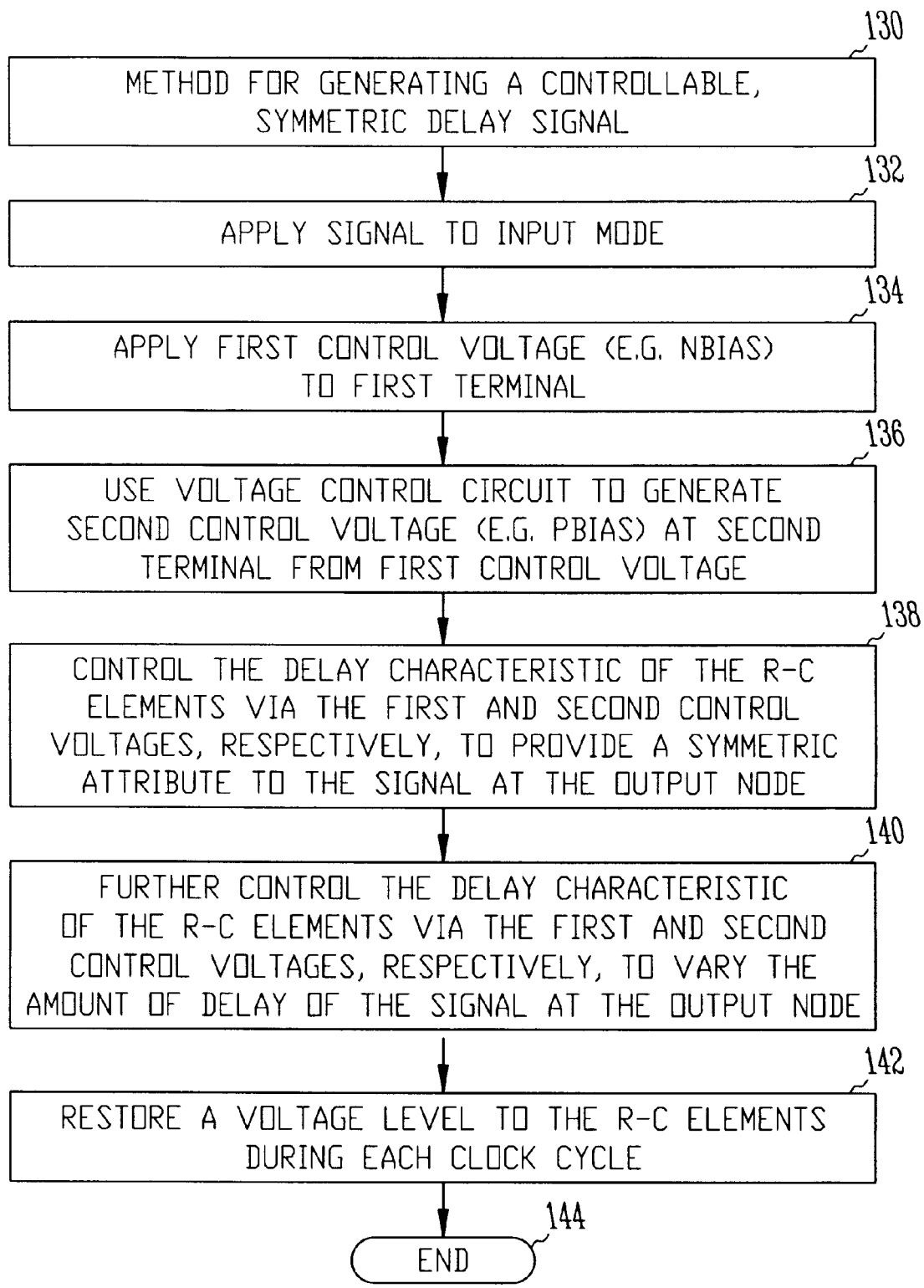
FIG. 7 illustrates a flow diagram of a method of generating a controllable, symmetric delay signal from a symmetric voltage-controlled CMOS delay cell, in accordance with one embodiment of the invention.

FIG. 7 illustrates a flow diagram of a method 130 of generating a controllable, symmetric delay signal from a symmetric voltage-controlled CMOS delay cell, in accordance with one embodiment of the invention.

In 132, a signal, e.g. a periodic signal, is applied to an input node of the delay cell.

In 134, a first control voltage (e.g. NBIAS) is applied to a first control terminal of the delay cell.

In 136, a voltage control circuit is used to generate a second control voltage (e.g. PBIAS) at a second control terminal. The second control voltage is generated from the first control voltage.

In 138, the delay characteristics of first and second R-C elements of a load cell are controlled via the first and second control voltages, respectively, to provide a symmetric attribute to the delayed signal at the output node of the delay cell.

In 140, the delay characteristics of the first and second R-C elements are further controlled via the first and second control voltages, respectively, to vary the amount of delay of the delayed output signal at the output node of the delay cell.

In 142, a voltage level is restored to the first and second R-C elements during each clock cycle. The R-C elements are preferably completely discharged once each clock cycle. The method ends at 144.

The operations described above with respect to the method illustrated in FIG. 7 can be performed in a different order from those described herein.

Conclusion

The present invention provides a signal delay that is controllable and symmetric (with respect to high/low and low/high propagations) over a substantial range of process, voltage, and temperature variations. The controllable delay circuit is relatively insensitive to supply line jitter. The use of symmetric load elements and independent NBIAS and PBIAS control voltages enables supply rail noise to be reduced both from Vcc and Vss.

In one embodiment, the signal delay circuit can be built around and incorporate an existing on-chip I/O circuit that has been compensated for process, voltage, and temperature variations. This significantly reduces the jitter in the delayed signal in comparison with using uncompensated circuitry.

An electronic system comprising IC's that incorporate the present invention can be tested more economically and quickly and can operate at higher clock speeds and with higher quality, so that it is therefore more commercially competitive.

As shown herein, the present invention can be implemented in a number of different embodiments, including a controllable delay circuit, a voltage-controlled load cell, an integrated circuit, an electronic system, a data processing system, and a method for generating a controllable, symmetric delay signal. Other embodiments will be readily apparent to those of ordinary skill in the art.

Many variations of the various circuitry appearing in the drawings will be apparent to those skilled in the art having the benefit of this disclosure. For example, the various circuits disclosed herein may be replaced with other circuits of different construction and of different quantity that, taken as a whole, perform the same or similar function. The general functions of the invention may also be performed by significantly different circuitry.

Where a single conductor is illustrated or described, it may be replaced by parallel conductors. Where parallel conductors are illustrated or described, they may be replaced by a single conductor.

The various structures of the present invention may be implemented according to any of various elements and methods known to those skilled in the art. There may be intermediate structure (such as an inverter or buffer) or signals that are between two illustrated structures. Some conductors may not be continuous as illustrated but rather they are broken up by intermediate structure. The borders of boxes in the figures are for illustrative purposes only. An actual device would not have to include such defined boundaries. The relative size and/or layout of the illustrate elements is not to suggest actual relative sizes or layout.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A controllable delay circuit comprising:
   a delay line to receive a signal and to output a delayed signal, the delay line comprising first and second inverters coupled serially and each having a respective output;
   two terminals responsive to first and second control voltages, respectively;
   at least one load cell coupled to the delay line and to the two terminals, the at least one load cell having a delay characteristic that is controllable by the first and second control voltages;
   a third inverter coupled to the output of the first inverter and to a first additional load cell, the output of the third inverter providing a first delay tap; and
   a fourth inverter coupled to the output of the second inverter and to a second additional load cell, the output of the fourth inverter providing a second delay tap.

2. The controllable delay circuit of claim 1, wherein the first and second control voltages are coupled to all of the load cells.

3. The controllable delay circuit of claim 1, wherein the at least one load cell comprises an NMOS transistor and a PMOS transistor, and wherein the first control voltage controls the NMOS transistor and the second control voltage controls the PMOS transistor.

4. The controllable delay circuit of claim 1, wherein the at least one load cell comprises a pair of resistive-capacitive (R-C) elements, each having a delay characteristic that is controllable by a respective one of the first and second control voltages.

5. The controllable delay circuit of claim 1, wherein the second control voltage is generated by a voltage control circuit from the first control voltage.

6. The controllable delay circuit of claim 5, wherein the voltage control circuit comprises:
   a CMOS transistor pair;
   an intermediate node between the transistors of the CMOS transistor pair; and
   a unity gain differential amplifier having a first input coupled to the intermediate node and a second input coupled to a reference potential.

7. The controllable delay circuit of claim 1, wherein the at least one load cell comprises at least one resistive-capacitive (R-C) circuit having a delay characteristic that is controllable by the first and second control voltages.

8. The controllable delay circuit of claim 7, wherein the at least one R-C circuit comprises a source-drain connected MOS capacitor of a first semiconducting type coupled to a MOS transistor of the same semiconducting type.

9. The controllable delay circuit of claim 8, wherein the at least one R-C circuit further comprises a source-drain connected MOS capacitor of a second semiconducting type coupled to a MOS transistor of the second semiconducting type.

10. The controllable delay circuit of claim 7, wherein the at least one load cell comprises at least one voltage level restoring circuit to periodically discharge the R-C circuit.

11. A voltage-controlled load cell for use in a controllable delay circuit having a delay line to receive a signal and to output a delayed signal, the voltage-controlled load cell comprising:
 a first resistive-capacitive (R-C) circuit having a delay characteristic that is controllable by a first control voltage;
 a second resistive-capacitive (R-C) circuit coupled to the first R-C circuit and having a delay characteristic that is controllable by a second control voltage, wherein the second control voltage is derived from the first control voltage; and
 at least one voltage level restoring circuit to periodically discharge the first and second R-C circuits.

12. The voltage-controlled load cell of claim 11, wherein the first R-C circuit comprises a source-drain connected MOS capacitor of a first semiconducting type coupled to a MOS transistor of the same semiconducting type.

13. The voltage-controlled load cell of claim 12, wherein the second R-C circuit comprises a source-drain connected MOS capacitor of a second semiconducting type coupled to a MOS transistor of the second semiconducting type.

14. An integrated circuit comprising:
 at least one controllable delay circuit having:
  a delay line to receive a signal and to output a delayed signal, the delay line comprising first and second inverters coupled serially and each having a respective output;
  two terminals responsive to first and second control voltages, respectively;
  at least one load cell coupled to the delay line and to the two terminals, the at least one load cell having a delay characteristic that is controllable by the first and second control voltages;
  a third inverter coupled to the output of the first inverter and to a first additional load cell, the output of the third inverter providing a first delay tap; and
  a fourth inverter coupled to the output of the second inverter and to a second additional load cell, the output of the fourth inverter providing a second delay tap.

15. The integrated circuit of claim 14, wherein the at least one load cell comprises a pair of resistive-capacitive (R-C) elements, each having a delay characteristic that is controllable by a respective one of the first and second control voltages.

16. An electronic system comprising:
 at least one controllable delay circuit having:
  a delay line to receive a signal and to output a delayed signal, the delay line comprising first and second inverters coupled serially and each having a respective output;
  two terminals responsive to first and second control voltages, respectively;
  at least one load cell coupled to the delay line and to the two terminals, the at least one load cell having a delay characteristic that is controllable by the first and second control voltages;
  a third inverter coupled to the output of the first inverter and to a first additional load cell, the output of the third inverter providing a first delay tap; and
  a fourth inverter coupled to the output of the second inverter and to a second additional load cell, the output of the fourth inverter providing a second delay tap.

17. The electronic system of claim 16, wherein the at least one load cell comprises a pair of resistive-capacitive (R-C) elements, each having a delay characteristic that is controllable by a respective one of the first and second control voltages.

18. A data processing system comprising:
 a plurality of components;
 a bus coupling the components; and
 wherein at least one component includes at least one controllable delay circuit having:
  a delay line to receive a signal and to output a delayed signal, the delay line comprising first and second inverters coupled serially and each having a respective output;
  two terminals responsive to first and second control voltages, respectively;
  at least one load cell coupled to the delay line and to the two terminals, the at least one load cell having a delay characteristic that is controllable by the first and second control voltages;
  a third inverter coupled to the output of the first inverter and to a first additional load cell, the output of the third inverter providing a first delay tap; and
  a fourth inverter coupled to the output of the second inverter and to a second additional load cell, the output of the fourth inverter providing a second delay tap.

19. The data processing system of claim 18, wherein the at least one load cell comprises a pair of resistive-capacitive (R-C) elements, each having a delay characteristic that is controllable by a respective one of the first and second control voltages.

20. The data processing system of claim 18, wherein the components are from the group consisting of a processor, chipset logic, and an external memory.

21. In an integrated circuit comprising a delay line having an input node and an output node, a first terminal, a voltage control circuit having a second terminal, and at least one load cell coupled to the delay line and to the first and second terminals, the at least one load cell comprising a pair of resistive-capacitive (R-C) elements, each having a delay characteristic, a method for generating a controllable, symmetric delay signal comprising:
 applying a signal to the input node;
 applying a first control voltage to the first terminal;
 using the voltage control circuit to generate a second control voltage at the second terminal from the first control voltage; and
 controlling the delay characteristic of the R-C elements via the first and second control voltages, respectively, in such as manner as to provide a symmetric delay attribute to the signal at the output node.

22. The method of claim 21, and further comprising:
further controlling the delay characteristic of the R-C elements via the first and second control voltages, respectively, in such as manner as to vary the amount of delay of the signal at the output node.

23. The method of claim 21, wherein the integrated circuit further comprises at least one voltage level restoring circuit coupled to the R-C elements, and wherein the load cell operates on a periodic clock cycle, the method further comprising:
the at least one voltage level restoring circuit restoring a voltage level to the R-C elements during each clock cycle.

24. In an integrated circuit comprising a delay line having an input node and an output node, a first terminal, a voltage control circuit having a second terminal, at least one load cell coupled to the delay line and to the first and second terminals and comprising a pair of resistive-capacitive (R-C) elements each having a delay characteristic, and at least one voltage level restoring circuit coupled to the R-C elements, a method for generating a controllable, symmetric delay signal comprising:
applying a signal to the input node;
applying a first control voltage to the first terminal;
the voltage control circuit generating a second control voltage at the second terminal from the first control voltage;
controlling the delay characteristic of the R-C elements via the first and second control voltages, respectively, in such as manner as to provide a symmetric delay attribute to the signal at the output node;
further controlling the delay characteristic of the R-C elements via the first and second control voltages, respectively, in such as manner as to vary the amount of delay of the signal at the output node; and
the at least one voltage level restoring circuit restoring a voltage level to the R-C elements during each clock cycle.

* * * * *

UNITED STATES PATENT AND TRADEMARK OFFICE
CERTIFICATE OF CORRECTION

PATENT NO.   : 6,377,103 B1
DATED        : April 23, 2002
INVENTOR(S)  : Mooney et al.

It is certified that error appears in the above-identified patent and that said Letters Patent is hereby corrected as shown below:

Column 3,
Line 65, delete "drives(s)" and insert -- drive(s) --, therefor.

Column 10,
Line 66, delete "in such as manner" and insert -- in such a manner --, therefor.

Column 11,
Line 4, delete "in such as manner" and insert -- in such a manner --, therefor.

Column 12,
Lines 10 and 14, delete "in such as manner" and insert -- in such a manner --, therefor.

Drawings,
Figure 7, in block "132", delete "MODE" and insert -- NODE --, therefor.

Signed and Sealed this

Twenty-third Day of July, 2002

*Attest:*

JAMES E. ROGAN
*Director of the United States Patent and Trademark Office*

*Attesting Officer*